United States Patent
Dsouza

(10) Patent No.: US 8,813,007 B2
(45) Date of Patent: Aug. 19, 2014

(54) AUTOMATIC APPROXIMATION OF ASSUMPTIONS FOR FORMAL PROPERTY VERIFICATION

(75) Inventor: Ashvin M. Dsouza, Chelmsford, MA (US)

(73) Assignee: Synopsys, Inc., Mountain View, CA (US)

( * ) Notice: Subject to any disclaimer, the term of this patent is extended or adjusted under 35 U.S.C. 154(b) by 350 days.

(21) Appl. No.: 12/425,597

(22) Filed: Apr. 17, 2009

(65) Prior Publication Data

US 2010/0269078 A1    Oct. 21, 2010

(51) Int. Cl.
*G06F 9/455* (2006.01)
*G06F 17/50* (2006.01)

(52) U.S. Cl.
USPC ............ 716/106; 716/107; 716/111; 716/136

(58) Field of Classification Search
USPC ................................................ 716/106, 107
See application file for complete search history.

(56) References Cited

U.S. PATENT DOCUMENTS

| | | | |
|---|---|---|---|
| 6,182,258 B1 | 1/2001 | Hollander | |
| 6,567,971 B1 | 5/2003 | Banzhaf | |
| 6,748,352 B1 * | 6/2004 | Yuen et al. | 703/16 |
| 2003/0115562 A1 | 6/2003 | Martin | |
| 2004/0261043 A1 * | 12/2004 | Baumgartner et al. | 716/4 |
| 2007/0156378 A1 | 7/2007 | McNamara | |
| 2008/0127009 A1 | 5/2008 | Veneris | |

* cited by examiner

*Primary Examiner* — Vuthe Siek
*Assistant Examiner* — Eric Lee
(74) *Attorney, Agent, or Firm* — Park, Vaughan, Fleming & Dowler LLP

(57) ABSTRACT

One embodiment provides a system, comprising methods and apparatuses, for simplifying a set of assumptions for a circuit design, and for verifying the circuit design by determining whether the circuit design satisfies a set of assertions when the simplified set of assumptions is satisfied. During operation, the system can simplify the set of assumptions by identifying, for an assertion in the set of assertions, a first subset of assumptions which, either directly or indirectly, shares logic with the assertion. Furthermore, the system can modify the first subset of assumptions to obtain a second subset of assumptions which either over-approximates or under-approximates the first subset of assumptions. Then, the system can refine the second subset of assumptions to either prove or falsify the assertion.

24 Claims, 7 Drawing Sheets

AUTOMATIC APPROXIMATION OF ASSUMPTIONS FOR FORMAL PROPERTY VERIFICATION

BACKGROUND

1. Field

This disclosure is generally related to electronic design automation. More specifically, this disclosure is related to techniques and systems for simplifying a set of assumptions used during formal circuit verification.

2. Related Art

Describing a circuit using a high-level hardware description language allows hardware engineers to define the circuit's functionality and to optimize the circuit's architecture before converting the high-level description into a detailed physical layout for the circuit.

The goal of formal verification techniques is to prove that the circuit under verification (CUV) will behave as desired during operation. Formal verification techniques typically utilize two types of logical functions: assumptions and assertions. Assumptions are logical functions that are used to model the runtime environment, and assertions are logical functions that define the desired behavior of the CUV. Without assumptions, the CUV is not constrained to legal behavior, and the assertions being verified may be incorrectly falsified.

It is desirable to reduce the amount of time required to formally verify a CUV. Unfortunately, the set of assumptions can be large and complex, and it can sometimes be computationally impractical to perform a formal analysis on the full set of assumptions when attempting to prove or falsify an assertion. Specifically, formal property verification is known to be a PSPACE-hard problem. Hence, a large and complex set of assumptions can disproportionately increase the complexity of the formal verification problem, making it computationally impractical to formally verify a CUV.

SUMMARY

Some embodiments provide systems and techniques for automatically approximating assumptions to reduce the complexity of the formal verification problem. Note that the approximated set of assumptions may not be logically equivalent to the original set of assumptions.

During operation, the system can optionally simplify the set of assumptions to obtain a simplified set of assumptions which is logically equivalent to the original set of assumptions. Next, the system can optionally associate a subset of the simplified assumptions with an assertion in the set of assertions. Note that associating a subset of assumptions with an assertion can reduce complexity because only the subset of assumptions (as opposed to the full set of assumptions) needs to be considered while proving the associated assertion.

The system can then approximate the simplified set of assumptions, thereby changing the set of allowable input assignments. If the simplification process was not performed, the system can approximate the original set of assumptions. Specifically, a set of assumptions can be under-approximated or over-approximated. When a set of assumptions is under-approximated, it restricts the sequence of input assignments that were allowable under the original set of assumptions. When a set of assumptions is over-approximated, it allows more input assignments than those that were allowed under the original set of assumptions. Note that, when a set of assumptions is approximated, the resulting set of assumptions is not logically equivalent to the original set of assumptions.

Once the system has an approximated set of assumptions, the system can use the approximated set of assumptions to perform formal verification. Note that if the set of assumptions is under-approximated, assertion falsification is preserved. In other words, a trace that falsifies an assertion for the under-approximated set of assumptions will also falsify the assertion for the original set of assumptions. Conversely, if the set of assumptions is over-approximated, assertion proofs are preserved, i.e., a proof of an assertion for the over-approximated set of assertions is also valid for the original set of assumptions.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Integrated Circuit (IC) Design Flow

Figure 1:
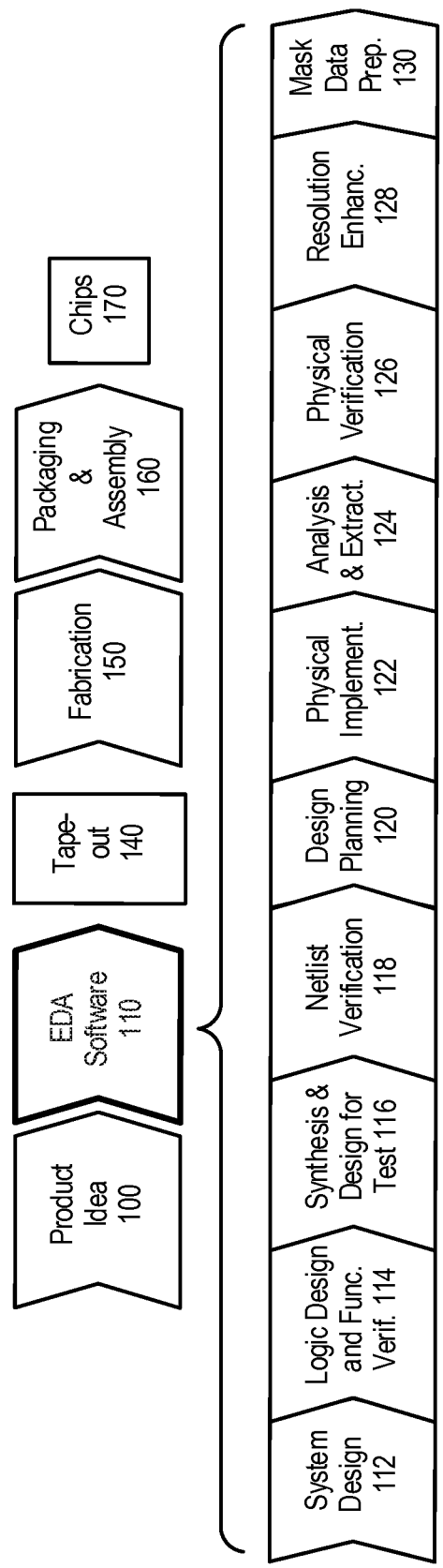
FIG. 1 illustrates various stages in the design and fabrication process of an integrated circuit in accordance with an embodiment of the present invention.

FIG. 1 illustrates various stages in the design and fabrication process of an integrated circuit in accordance with an embodiment of the present invention.

The IC design process typically begins with a product idea (operation 100) which is realized using an EDA process (operation 110). Once the design is finalized, it is typically taped-out (event 140), at which point it goes through a fabrication process (operation 150) and packaging and assembly processes (operation 160) to produce manufactured microchips (result 170).

The EDA process (operation 110) comprises operations 112-130, which are described below for illustrative purposes only and are not meant to limit the present invention. Specifically, an actual integrated circuit design may require a designer to perform the design operations in a different sequence than the sequence described below.

System design (operation 112): In this stage, the designers describe the functionality that implements the product idea. They can also perform what-if planning to refine the functionality, perform cost analysis, etc. Hardware-software architecture partitioning can occur at this stage. Exemplary EDA software products from Synopsys, Inc. that can be used at this stage include Model Architect, Saber®, System Studio, and DesignWare®.

Logic design and functional verification (operation 114): At this stage, the VHDL or Verilog code for modules in the system is written and the design is checked for functional accuracy. More specifically, the design is checked to ensure that it produces a correct response. Exemplary EDA software products from Synopsys, Inc. that can be used at this stage include VCS®, Vera®, DesignWare®, Magellan™, Formality®, ESP and Leda®. Synthesis and design for test (operation 116): The VHDL/Verilog source code can be translated to a netlist in this stage. The netlist can be optimized for the target technology, and tests can be designed and implemented to check the manufactured microchips. Exemplary EDA software products from Synopsys, Inc. that can be used at this stage include Design Compiler®, Physical Compiler®, Test Compiler, Power Compiler™, FPGA Compiler, Tetra-MAX®, and DesignWare®.

Netlist verification (operation 118): In this stage, the netlist is checked for compliance with timing constraints and for correspondence with the VHDL % Verilog source code. Exemplary EDA software products from Synopsys, Inc. that can be used at this stage include Formality®, PrimeTime®, and VCS®.

Design planning (operation 120): In this stage, an overall floorplan for the microchip is constructed and analyzed for timing and top-level routing. Exemplary EDA software products from Synopsys, Inc. that can be used at this stage include Astro™ and IC Compiler products.

Physical implementation (operation 122): The placement (positioning of circuit elements) and routing (placement of interconnections) occur at this stage. Exemplary EDA software products from Synopsys, Inc. that can be used at this stage include Astro™ and IC Compiler products.

Analysis and extraction (operation 124): At this stage, the circuit function is verified at a transistor level; this, in turn, permits what-if refinement. Exemplary EDA software products from Synopsys, Inc. that can be used at this stage include AstroRail™, PrimeRail, PrimeTime®, and Star-RCXT™.

Physical verification (operation 126): In this stage, the design is checked to ensure correctness for manufacturing, electrical issues, lithographic issues, and circuitry. Hercules™ is an exemplary EDA software product from Synopsys, Inc. that can be used at this stage.

Resolution enhancement (operation 128): This stage involves geometric manipulations of the layout to improve manufacturability of the design. Exemplary EDA software products from Synopsys, Inc. that can be used at this stage include Proteus/Progen, ProteusAF, and PSMGen.

Mask data preparation (operation 130): This stage provides the "tape-out" data for production of masks to produce finished chips. Exemplary EDA software products from Synopsys, Inc. that can be used at this stage include the CATS® family of products.

Overview

Some embodiments provide systems and techniques that employ formal verification techniques to prove that the CUV will behave as desired during operation. In some embodiments, these formal verification techniques verify the functionality of the CUV by determining whether the CUV satisfies a set of assertions when a set of assumptions is satisfied. An assumption is a set of logical functions that is used to model a legal behavior for the runtime environment of the CUV. An assertion is a set of logical functions that defines a legal behavior of the CUV. Note that the runtime environment of the CUV can include at least a number of primary inputs and/or primary outputs for the CUV.

In some embodiments, the system formally verifies an assertion for the CUV by first determining whether the set of assumptions for the CUV are satisfied by the runtime environment of the CUV. If the set of assumptions are not satisfied, the system does not formally verify the assertions because the CUV is not in a legal state. On the other hand, if the set of assumptions are satisfied, the system tries to prove the assertions.

In some embodiments, the system facilitates performing formal verification on a large CUV by generating an approximation to the set of assumptions required to prove or falsify an assertion in the set of assertions.

Figure 2:
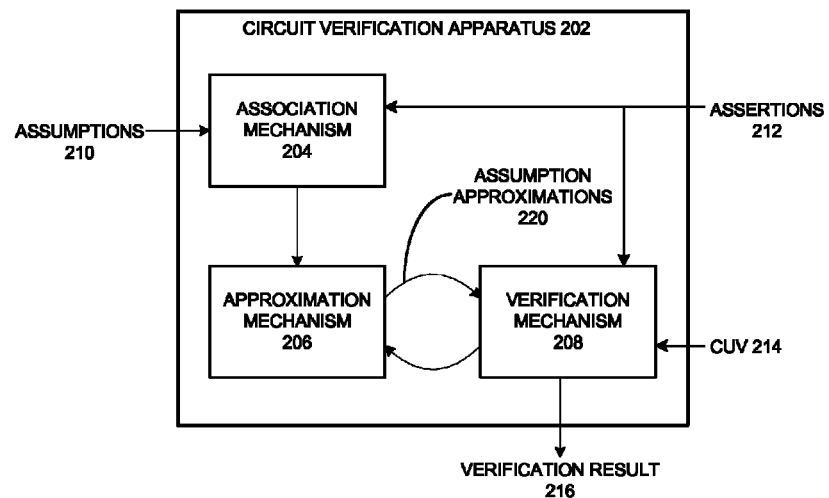
FIG. 2 illustrates an apparatus for performing circuit verification by approximating assumptions in accordance with an embodiment of the present invention.

FIG. 2 illustrates an apparatus that facilitates performing circuit verification by approximating assumptions in accordance with an embodiment of the present invention. Apparatus 202 can comprise a number of mechanisms which may communicate with one another via a wired or wireless communication channel. Apparatus 202 may be realized using one or more integrated circuits, and it may be integrated in a computer system, or it may be realized as a separate device which is capable of communicating with other computer systems and/or devices. Specifically, circuit verification apparatus 202 can include an association mechanism 204, an approximation mechanism 206, and a verification mechanism 208.

In some embodiments, circuit verification apparatus 202 takes as input a CUV 214, assumptions 210 which model the legal operating environment for CUV 214, and assertions 212 which define the desired behavior of CUV 214. Circuit verification apparatus 202 generates a verification result 216 as an output, which specifies whether or not CUV 214 satisfies assertions 212 when assumptions 210 are satisfied.

Note that assumptions can be combinational or sequential. A combinational assumption specifies a logical relationship between two or more variables whose values are evaluated at a particular point in time. On the other hand, a sequential assumption specifies a logical relationship between two or more variables whose values are evaluated at different points in time. For example, a combinational assumption may state that whenever state variable "a" is true, state variable "b" must also be true. On the other hand, a sequential assumption may state that whenever state variable "a" is true, state variable "b" must remain true for at least "n" cycles.

Association mechanism 204 can associate assumptions 210 with assertions 212. An assumption can be associated with an assertion if the assumption, either directly or indirectly, shares logic with the assertion. The output of association mechanism 204 can be input into an approximation mechanism which approximates the assumptions.

Approximation mechanism 206 can generate assumption approximations 220, such that assumption approximations 220 approximate assumptions 210. Note that a set of assumptions $A_1$ under-approximates a set of assumptions $A_2$ if the set of input sequences for the CUV that are allowed by $A_1$ are also allowed by $A_2$. Conversely, the set of assumptions $A_1$ over-approximates the set of assumptions $A_2$ if the set of input sequences for the CUV that are allowed by $A_2$ are also allowed by $A_1$. The set of assumptions $A_1$ is logically equivalent to the set of assumptions $A_2$ if $A_1$ both under-approximates and over-approximates $A_2$.

When a set of assumptions is over-approximated, the additional input sequences can cause the assertion to be falsified incorrectly. Therefore, in an over-approximation scenario, if an assertion is falsified by verification mechanism 208, circuit verification apparatus 202 may use approximation mechanism 206 to refine assumption approximations 220, and try to verify the assertions under the refined assumptions.

Similarly, when a set of assumptions is under-approximated, the absence of certain input sequences can cause the assertion to be proven incorrectly. Therefore, in an under-approximation scenario, if an assertion is proven by verification mechanism 208, circuit verification apparatus 202 may use approximation mechanism 206 to refine assumption approximations 220, and try to verify the assertions under the refined assumptions.

Note that the interactions between verification mechanism 208 and approximation mechanism 206 can allow circuit verification apparatus 202 to iteratively refine assumption approximations 220 until circuit verification apparatus 202 either proves or falsifies assertions 212 for the CUV.

Figure 3:
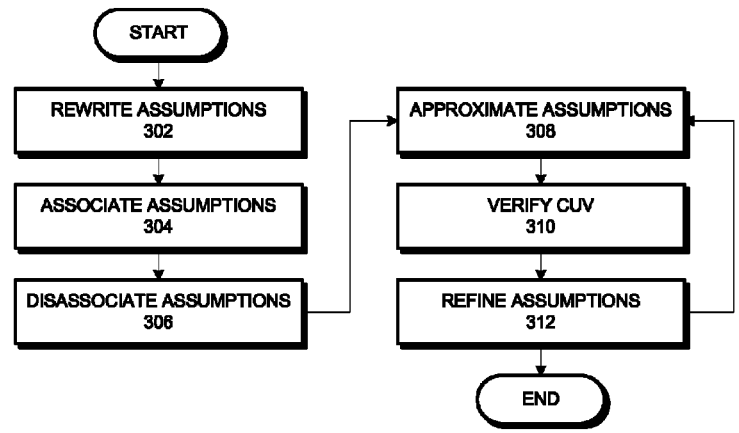
FIG. 3 illustrates various stages in a procedure for verifying a circuit design using assumption approximations in accordance with an embodiment of the present invention.

FIG. 3 illustrates various stages in a procedure performed by a circuit verification system to verify a circuit design using assumption approximations in accordance with an embodiment of the present invention. In some embodiments, the procedure includes six operation stages: rewrite assumptions, associate assumptions, disassociate assumptions, approximate assumptions, verify CUV, and refine assumptions. Note that one or more stages can be skipped or their order can be changed. For example, in some embodiments, the system may only perform the approximate assumption stage and the verify CUV stage.

REWRITE (operation 302): The system rewrites the assumptions for the CUV into smaller assumptions that together are equivalent to the original assumptions for the CUV. Note that the total size of the assumptions can increase after performing REWRITE operation 302, but the scope decreases for an assumption which has been rewritten.

ASSOCIATE (operation 304): The system associates a subset of the assumptions with an assertion. Specifically, the system can use the assumptions generated by REWRITE operation 302 in this operation. In general, all assumptions are associated with all assertions. Hence, without this operation, a formal verification tool would consider all assumptions while proving or falsifying an assertion.

DISASSOCIATE (operation 306): Structural analysis can be conservative. Hence, the ASSOCIATE operation 304 may associate an assumption with an assertion, even though the assumption is not useful for proving or falsifying the assertion. During DISASSOCIATE operation 306, the system performs a detailed analysis to identify an assumption such that the associated assertion is satisfiable regardless of whether the assumption is satisfied or not. The system then disassociates the identified assumptions from the assertion.

APPROXIMATE (operation 308): The system relaxes the requirement that the set of assumptions be equivalent to the original set of assumptions with respect to each assertion. Doing so allows the system to rewrite and disassociate assumptions more aggressively, thereby producing a set of assumptions which is significantly reduced from the original set of assumptions. If the system is attempting to falsify an assertion, then the system generates a set of assumption approximations which under-approximates the original set of assumptions. Otherwise, if the system is attempting to prove an assertion, then the system generates a set of assumption approximations which over-approximates the original set of assumptions.

VERIFY (operation 310): The system performs formal verification on the CUV using the assumption approximations. Note that, if the set of assumption approximations is an over-approximation to the initial set of assumptions, the system attempts to prove the associated assertions. Otherwise, if the set of assumption approximations is an under-approximation to the initial set of assumptions, the system attempts to falsify the associated assertions.

REFINE (operation 312): If the system successfully proves or falsifies the assertions, then the procedure ends. Otherwise, the system returns to the APPROXIMATE step to generate a new set of assumption approximations, using information gathered from the inconclusive VERIFY operation.

Note that operations 302-306 can be considered to be part of a static phase, which preserves the invariant that the set of modified assumptions is equivalent to the set of original assumptions. In other words, performing operations 302-306 generates a reduced set of assumptions for the selected assertion, such that proving or falsifying the assertion using the reduced set of assumptions is equivalent to proving or falsifying the assertion using the initial set of assumptions for the CUV. In some embodiments, operations 302-306 can be performed by association mechanism 204 in FIG. 2.

Operations 308-312 can be considered to be part of a dynamic phase, which iteratively refines a set of assumption approximations until an assertion is successfully proven, or until the assertion is successfully falsified. In some embodiments, operation 308 can be performed by approximation mechanism 206 in FIG. 2. Furthermore, operations 310-312 can be performed by verification mechanism 208 in FIG. 2.

Rewrite

In some embodiments, REWRITE operation 302 can simplify an assumption from the original set of assumptions, to produce one or more assumptions which together are equivalent to the original assumption being simplified. For example, REWRITE operation 302 can perform one or more operations from the group of operations comprising: conjunction splitting, implication splitting, repetition range splitting, implication repetition range splitting, bit slicing, large sub-expression elimination, assumption elimination, and any other operation which can transform an assumption into conjunction normal form (CNF) before partitioning the assumption using conjunction splitting. These operations are described in more detail below.

Conjunction Splitting

If an assumption is a conjunction of terms, it can be replaced by a set of assumptions, in which each term is an assumption. For example, given an assumption comprising n terms:

$a_1 \& \ldots \& a_n,$

REWRITE operation 302 can replace the assumption with n smaller assumptions, $a_1$ through $a_n$.

Implication Splitting

An environment constraint for a CUV is typically described using a conjunction of logical terms under an implication, such that the conjunction of the logical terms specifies the consequences of a particular event (i.e., a particular set of values for primary inputs, primary outputs, and/or state variables for the CUV). For example, the following assumption comprises a conjunction of logical terms, $b_1 \& \ldots \& b_n$, which must be satisfied if logical term a is satisfied:

$a \mapsto (b_1 \& \ldots \& b_n)$

REWRITE operation 302 can transform the assumption by distributing the implication to the individual terms (i.e., by moving the conjunction above the implication). By doing so, REWRITE operation 302 creates a conjunction of implications, where a logical term $b_i$ must be satisfied when logical term a is satisfied:

$(a \mapsto b_1) \& \ldots \& (a \mapsto b_n).$

Then, REWRITE operation 302 can apply conjunction splitting to obtain n individual assumptions of the form:

$(a \mapsto b_i),$ where i ranges from 1 to n. Together, the set of n individual assumptions is equivalent to the original assumption.

Note that implication splitting produces n individual assumptions which have a common antecedent, thereby producing a set of assumptions which when taken together are larger than the original assumption. However, combining the implication splitting transformation with APPROXIMATE operation 308 can significantly decrease the complexity of the final set of assumptions.

Repetition Range Splitting

An assumption can specify a range for the number of cycles over which an expression must hold. In some embodiments, REWRITE operation 302 can replace the range with the minimum number of cycles over which the range holds. For example, given the following assumption which states that a function f must hold true for between 8 and 32 cycles:

$f[*8:32],$

REWRITE operation 302 can rewrite the assumption with an equivalent assumption which states that f must hold true for at least 8 cycles:

$f[*8]$

Implication and Repetition Range Splitting

A repetition range can occur as a sub-expression of an assumption. It is not always safe to perform repetition range splitting on sub-expressions, but it is safe to perform repetition range splitting for the following assumption which states that a term f must hold for between 8 and 32 cycles when term a is satisfied:

$a \mapsto f[*8:32].$

REWRITE operation 302 can replace the assumption with the following equivalent assumption which states that f must hold for at least 8 cycles when term a is satisfied:

$a \mapsto f[*8]$

Bit Slicing

An assumption which involves vectors tends to be large and complicated to decompose, especially when the assumption is sequential in nature. However, it is possible to slice such assumptions in a bit-wise manner using data flow analysis. For example, consider the following assumption comprising 32-bit vectors u and v, and bits a and b. The following assumption states that after bit a is set, vectors u and v must be equal for 10 cycles, followed by bit b being set 8 cycles later:

$a \mapsto (v = = u)[*10] \#\# 8b.$

REWRITE operation 302 can rewrite the assumption into 32 assumptions of the following form, where i ranges from 1 to 32:

$a \mapsto (v[i] = = u[i])[*10] \#\# 8b.$

Large Sub-Expression Elimination

A combinational assumption of the form $f(i,s,g(i'))$, where i and i' are primary inputs to the CUV and s is a state variable, is equivalent to:

$f(i,s,r) \& (r = = g(i')),$ where r is a new variable that is introduced by REWRITE operation 302. Note that, if i and i' are unrelated inputs to the CUV, then the expression $r = g(i')$ can be solved independently of the expression $f(i,s,r)$.

In some embodiments, REWRITE operation 302 can replace the original assumption with $f(i,s,r)$ for verification. Then, when falsifying an assertion, REWRITE operation 302 can fill in appropriate values for i' by solving $r = g(i')$ for each value of r in the falsification.

Assumption Elimination

For an assumption of the form $a = f(b)$, where a is a primary input to the CUV, REWRITE operation 302 can replace all occurrences of a in the set of assumptions with $f(b)$, and remove the assumption for a from the set of assumptions. By doing so, REWRITE operation 302 reduces the number of inputs to the CUV which are associated with an assumption, thereby simplifying the problem of associating assumptions with an assertion.

Conjunctive Normal Form

In some embodiments, REWRITE operation 302 can partition an assumption which does not fit into an aforementioned category by first transforming the assumption into conjunctive normal form (CNF). Then, REWRITE operation 302 can partition the transformed assumption into smaller assumptions using conjunction splitting. Note that if the assumption is too large to convert to conjunctive normal form directly, REWRITE operation 302 can determine cut-points in the expression of the assumption, and convert the fragment of the assumption between cut-points into conjunctive normal form.

Associate

In some embodiments, ASSOCIATE operation 304 can associate assumptions with an assertion by identifying shared logic between an assumption and the assertion. Note that an assumption a is associated with an assertion b if there is a primary input to the CUV that fans out to both a and b (in this example, the assumption a and assertion b directly share logic). Association is transitive such that an assumption x sharing logic with an assumption y will be associated with an assertion z if y shares logic with z, even if x does not directly share logic with z (in this example, assumption x and assertion z indirectly share logic). In other words, an assumption is associated with an assertion if the assumption, either directly or indirectly, shares logic with the assertion.

Disassociate

Even after performing the above-described operations, the verification problem may still have too many assumptions that are associated with an assertion. In some embodiments, DISASSOCIATE operation 306 can be used to further reduce the number of assumptions which are associated with an assertion. Specifically, DISASSOCIATE operation 306 can perform at least one or more of a quantification operation and a disjunction operation.

Quantification

In some embodiments, DISASSOCIATE operation 306 can determine whether an assumption is associated with an assertion. For example, consider an assertion a, and an assumption b that is associated with the assertion because they share primary inputs $i_1, \ldots, i_n$. DISASSOCIATE operation 306 can compute the expression $\forall i_1, \ldots, i_n.b$ and test if it is satisfiable, i.e., DISASSOCIATE operation 306 can determine whether assumption b is satisfiable for all values of primary inputs $i_1, \ldots, i_n$. If the expression is not satisfiable, then DISASSOCIATE operation 306 must retain the association between assumption b and assertion a. Otherwise, DISASSOCIATE operation 306 can disassociate assumption b from assertion a, because assumption b can be satisfied independently of assertion a. Further, in some embodiments, DISASSOCIATE operation 306 can apply the above-described quantification process to pairs of assumptions to break a transitive chain of assumptions.

Disjunction

In some embodiments, DISASSOCIATE operation 306 can disassociate an assumption of the form $a_1 \| a_2$ from an assertion c if either assumption $a_1$ or assumption $a_2$ does not share logic with assertion c, and the assumption can be satisfied independently of assertion c (e.g., using quantification).

Approximate

The dynamic analysis performed by operations 308-312 can generate a set of assumption approximations which are an over-approximation to the initial set of assumptions. The over-approximated assumptions can then be used to prove that the CUV satisfies an assertion.

The dynamic analysis can also generate a set of assumption approximations which are an under-approximation to the initial set of assumptions. The under-approximated assumptions can then be used to falsify an assertion.

The following sections describe techniques that can be used for approximating assumptions.

Over-Approximation

Disassociation Techniques

In some embodiments, APPROXIMATE operation 308 uses an approximation technique which can reduce an implication and/or a disjunction of an assumption, thereby further reducing a set of assumptions received from DISASSOCIATE operation 306.

Implication

In some embodiments, APPROXIMATE operation 308 disassociates an implication assumption of the form $a \mapsto b$ from an assertion c if term b does not share logic (directly or indirectly) with assertion c, even if term a shares logic (directly or indirectly) with assertion c. Note that the conditions imposed by the environment are typically enforced by the consequent of an implication assumption (i.e., term b) rather than the antecedent of the implication assumption (i.e., term a).

Disjunction

In some embodiments, APPROXIMATE operation 308 disassociates an assumption of the form $a_1 \| a_2$ from an assertion c if either term $a_1$ or term $a_2$ does not share logic (directly or indirectly) with assertion c. In some embodiments, APPROXIMATE operation 308 does not verify that either term $a_1$ or term $a_2$ can be satisfied independently of assertion c.

Rewrite Techniques

In some embodiments, APPROXIMATE operation 308 can transform a set of assumptions into an over-approximation by relaxing bounds on a repetition range of an assumption. Furthermore, APPROXIMATE operation 308 can transform a set of assumptions into an over-approximation by replacing a large combinational sub-expression with non-deterministic values.

Repetition Ranges Inside Delays

Some assumptions, such as the following one, state that, if term a holds, then expression f must hold for between m and n cycles, and then expression c must hold after p cycles:

$$a \mapsto f[m:n]\#\#pc$$

In some embodiments, APPROXIMATE operation 308 can generate an over-approximation for the assumption by replacing it with the following assumption which relaxes the condition on expression f to just hold for at least m cycles:

$$a \mapsto f[*m:\$]\#\#pc.$$

Note that the value for parameter m is typically small (e.g., m is typically 1), and the value for parameter n can be large. Therefore, removing parameter n from the assumption can simplify the assumption significantly.

Large Sub-Expression Elimination

A combinational assumption can have the form $f(i,s,g(i', s'))$, where i and i' are primary inputs to the CUV, and s and s' are state elements. In some embodiments, APPROXIMATE operation 308 can generate an over-approximation for the combinational assumption by rewriting the assumption in the form $f(i,s,r)$, such that r is a new variable used to replace $g(i', s')$ in the original assumption. Note that VERIFY operation 310 can use the new assumption to prove an assertion during verification even if i is associated with i'. If the assertion is falsified, we may not be able to solve $r = g(i', s')$ for some values of r and s, but the process can recover from such scenarios.

Under-Approximation

Rewriting a Delay Range

Range information within an assumption can add to the complexity of formal verification, because it can cause a large amount of branching in the state space. The following assumption specifies that, if term a is satisfied, then term c must be satisfied between m and n cycles after term b is satisfied:

$$a \mapsto b\#\#[m:n]c.$$

This assumption results in m−n+1 possible outcomes at each state, one for each delay value in the specified range. Note that the complexity in proving or falsifying an assumption increases for larger values of m−n+1. Therefore, the complexity can be substantially reduced by minimizing the number of delay values that fall within the range. Note that a design error typically occurs at the extremities of a delay range. Therefore, APPROXIMATE operation 308 can generate an under-approximation which reduces the complexity of the assumption by rewriting the assumption so that it only considers term c being satisfied after exactly m or exactly n cycles. The rewritten assumption reduces the number of outcomes at each state to 2, and can be expressed as:

$$(a \mapsto b\#\#mc) \text{ or } (a \mapsto b\#\#nc).$$

Large Sub-Expression Elimination

A combinational assumption can have the form $f(i,s,g(i', s'))$, where i and i' are primary inputs to the CUV, and s and s' are state elements. In some embodiments, APPROXIMATE operation 308 can generate an under-approximation for the combinational assumption by rewriting the assumption in the form $f(i,s,r)$, such that r is a constant value used to replace $g(i',s')$ in the original assumption. In some variations, r can include a set of allowable constant values, such that the value used to replace $g(i', s')$ can be selected using a non-deterministic selection algorithm. Note that VERIFY operation 310 can use the new assumption to prove an assertion during verification even if i and i' are related.

Inference from Biasing

In some embodiments, APPROXIMATE operation 308 can annotate an input of the CUV with biasing information that is specified by the user. This biasing information can be used to set a value to a constant in an assumption when the assumption is being analyzed by VERIFY operation 310.

Datapath Methods

A datapath assumption can include a relational operator which compares the values between two datapath variables. In some embodiments, APPROXIMATE operation 308 can rewrite a datapath assumption using an equality. For example, APPROXIMATE operation 308 can perform the following rewrites: the datapath assumption a<b can be rewritten as a==2*b, and the datapath assumption a>b can be rewritten as b==2*a. (Note that the multiplier "2" was chosen for illustrative purposes only; the datapath assumptions could have been rewritten using any positive multiplier.)

Verify

In some embodiments, VERIFY operation 310 can use a set of assumption approximations to verify an assertion for a CUV using standard formal verification techniques. Note that if the set of assumption approximations is an over-approximation to the initial set of assumptions for the CUV, then VERIFY operation 310 uses the set of assumption approximations to prove the validity of the assertion. Conversely, if the set of assumption approximations is an under-approximation to the initial set of assumptions for the CUV, then VERIFY operation 310 uses the set of assumption approximations to falsify the assertion.

Refine

In some embodiments, REFINE operation 312 can interpret the results from VERIFY operation 310 to determine whether VERIFY operation 310 has successfully proven or falsified an assertion.

Over-Approximation

If the set of assumption approximations is an over-approximation to the initial set of assumptions for the CUV, then a proof of an assertion is conclusive. However, if VERIFY operation 310 falsifies an assertion, then the system can simulate the falsification trace against the initial set of assumptions to identify one or more assumptions that are violated by the trace.

If the system determines that no assumptions were violated, then the assertions have also been falsified for the initial set of assumptions, and the system can report the falsification of the assertions to the user.

On the other hand, if the system identifies one or more assumptions that were violated, the violated assumptions are flagged to prevent the system from approximating these assumptions in the future. Next, the system can input the initial set of assumptions (which may include flagged assumptions) to APPROXIMATE operation 308 for approximation. Once the APPROXIMATE operation 308 generates a new set of assumption approximations which over-approximate the initial set of assumptions, the system can use them for verification. Note that the identification and flagging of violated assumptions can be performed by REFINE operation 312.

Under-Approximation

If the set of assumption approximations is an under-approximation to the initial set of assumptions for the CUV, then a falsification of an assertion is conclusive. However, if VERIFY operation 310 proves an assertion, the system can use APPROXIMATE operation 308 to generate a new set of assumption approximations.

Specifically, the system can identify an assumption from the initial set of assumptions which was used to prove the assertion, and flag the identified assumption so that the flagged assumption is not modified during subsequent approximation operations. The system can also increase the threshold for a heuristic that the system uses to select assumptions for approximations. For example, the heuristic may select only those assumptions that are larger than the threshold. Note that the identification and flagging of assumptions that were used in the proof can be performed by REFINE operation 312.

Formal Property Verification

Figure 4:
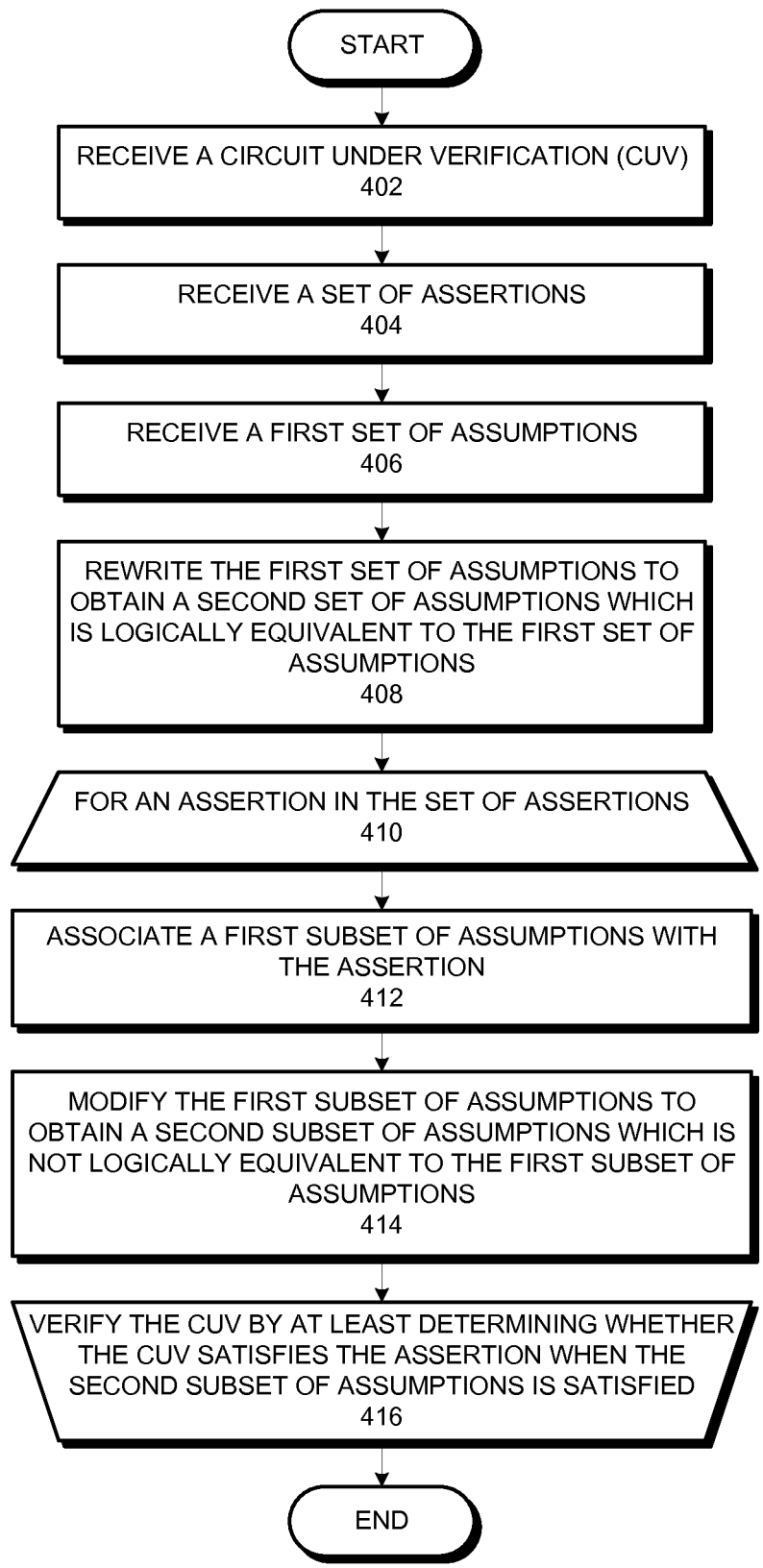
FIG. 4 presents a flow chart illustrating a process for verifying a circuit design using assumption approximations in accordance with an embodiment of the present invention.

FIG. 4 presents a flow chart illustrating a process for verifying a CUV using assumption approximations in accordance with an embodiment of the present invention. In some embodiments, the process can be performed by a computer system, which includes a computer-readable storage medium storing instructions that when executed by the computer system cause the computer system to perform the process for verifying the CUV.

The system can begin by receiving a CUV (operation 402), receiving a set of assertions (operation 404), and receiving a first set of assumptions (operation 406). Next, the system rewrites the first set of assumptions to obtain a second set of assumptions which is logically equivalent to the first set of assumptions (operation 408). Note that the cardinality of the second set of assumptions can be greater than the cardinality of the first set of assumptions. However, the individual assumptions in the second set of assumptions are typically smaller than the assumptions in the first set of assumptions.

Then, for an assertion in the set of assertions (operation 410), the system associates a first subset of assumptions with the assertion (operation 412), and modifies the first subset of assumptions to obtain a second subset of assumptions which is not logically equivalent to the first subset of assumptions (operation 414). Note that the first subset of assumptions can be a subset of the second set of assumptions, and the second subset of assumptions can be an approximation of the first subset of assumptions. The system then verifies the CUV by at least determining whether the CUV satisfies the assertion when the second subset of assumptions is satisfied (operation 416). Once the system determines that the CUV satisfies all assertions when the associated assumptions are satisfied, the system can declare that the CUV satisfies the assertions.

In some embodiments, operation 414 modifies the first subset of assumptions to obtain a second subset of assumptions which over-approximates the first subset of assumptions. In other embodiments, operation 414 modifies the first subset of assumptions to obtain a second subset of assumptions which under-approximates the first set of assumptions.

Figure 5:
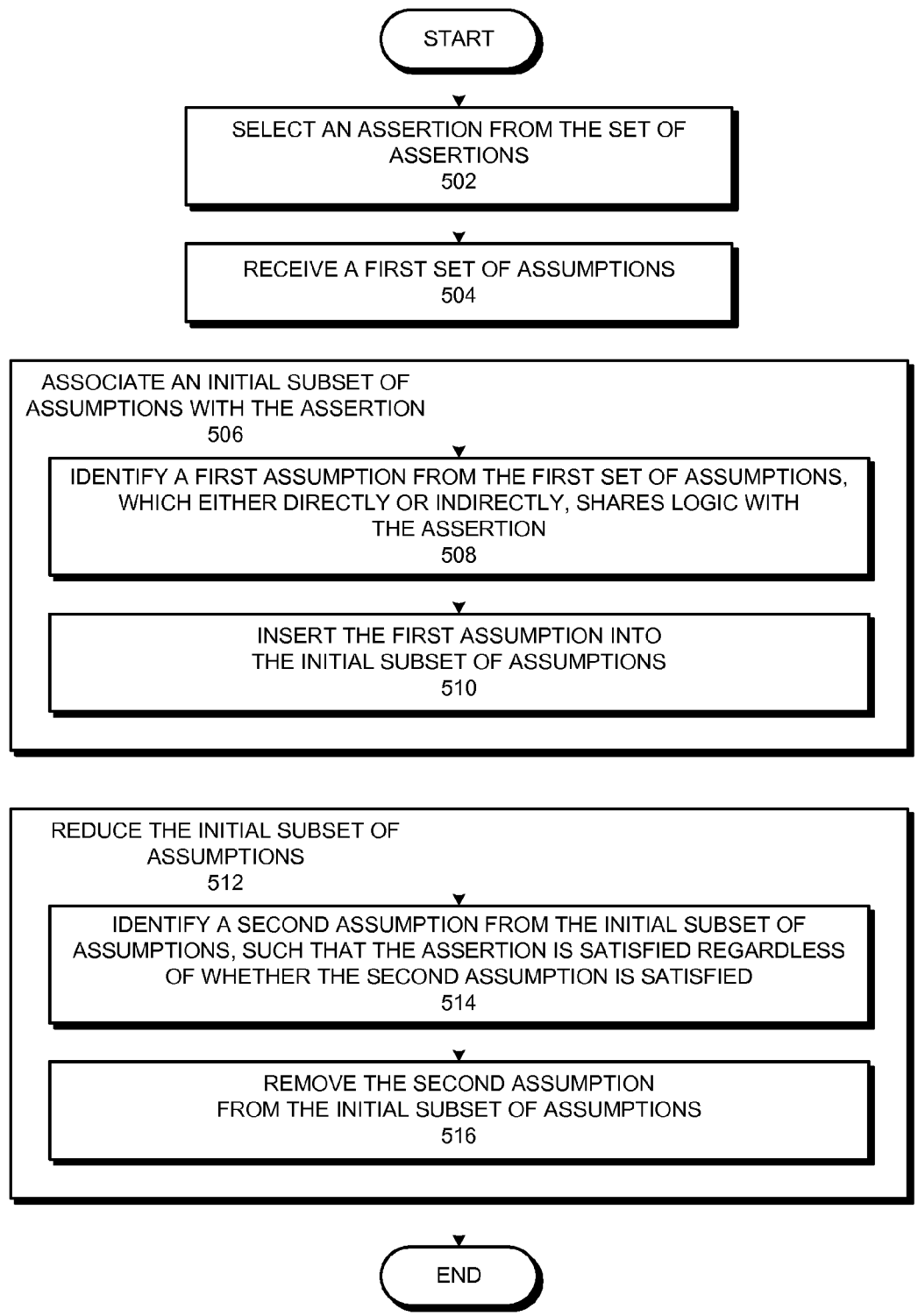
FIG. 5 presents a flow chart illustrating a process for associating a subset of assumptions with an assertion in accordance with an embodiment of the present invention.

FIG. 5 presents a flow chart illustrating a process for associating a subset of assumptions with an assertion in accordance with an embodiment of the present invention. In some embodiments, the process expands upon operation 412 of FIG. 4. The system can begin by selecting an assertion from the set of assertions (operation 502), and receiving a first set of assumptions (operation 504). Next, the system associates an initial subset of assumptions with the assertion (operation 506). The system may initialize the initial subset of assumptions to a null set, and iteratively add assumptions to the set. Specifically, the system can identify a first assumption from the first set of assumptions which, either directly or indirectly, shares logic with the assertion (operation 508), and insert the first assumption into the initial subset of assumptions (operation 510).

Then, the system reduces the initial subset of assumptions (operation 512). To do so, the system can iteratively remove assumptions from the initial subset of assumptions. Specifically, the system identifies a second assumption from the initial subset of assumptions, such that the assertion is satisfied regardless of whether the second assumption is satisfied (operation 514), and the system removes the second assumption from the initial subset of assumptions (operation 516).

Figure 6:
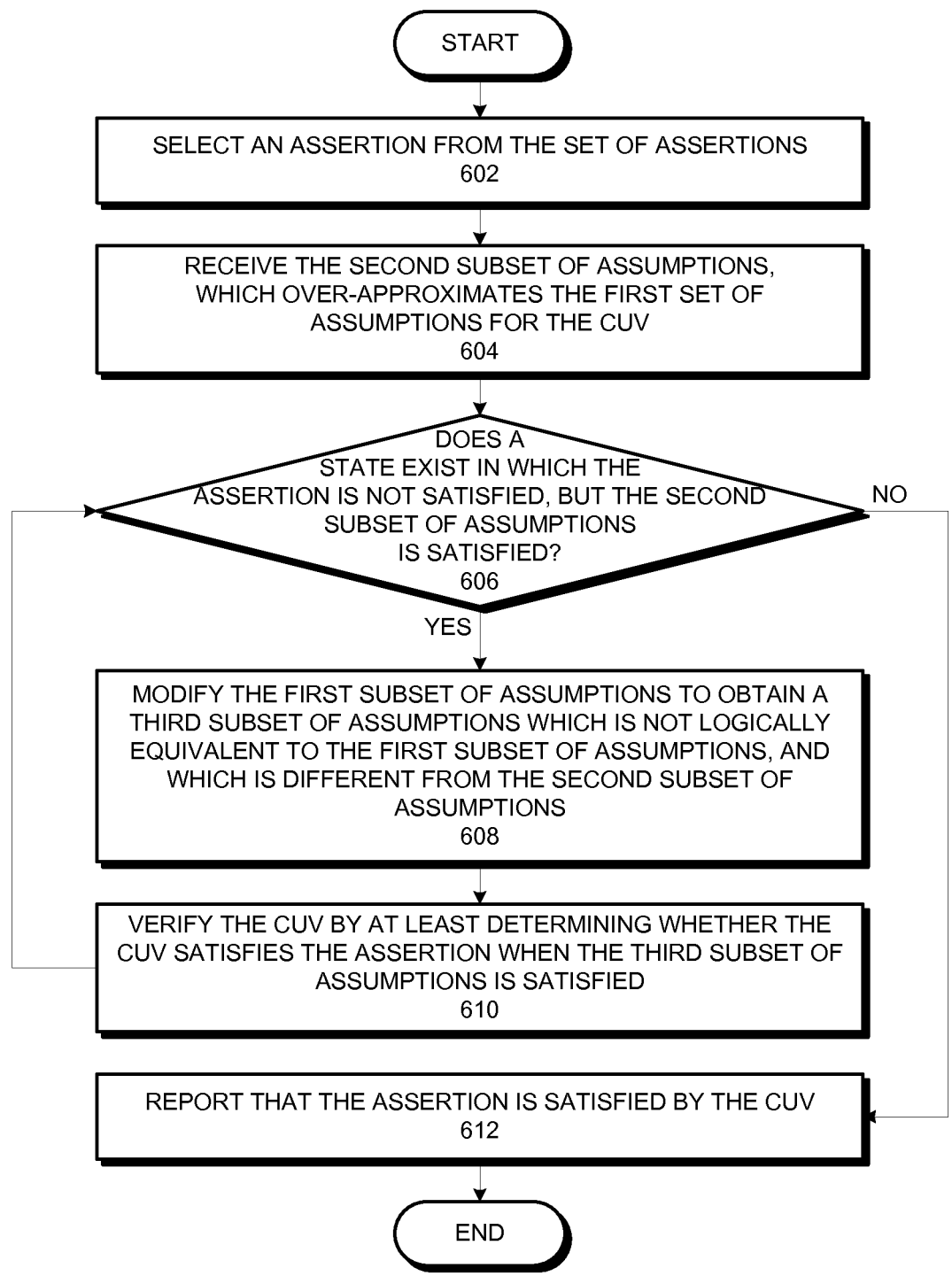
FIG. 6 presents a flow chart illustrating a process for verifying a circuit design by refining a subset of assumptions which over-approximates an initial set of assumptions in accordance with an embodiment of the present invention.

FIG. 6 presents a flow chart illustrating a process for verifying a circuit design by refining a subset of assumptions which over-approximates an initial set of assumptions in accordance with an embodiment of the present invention.

In some embodiments, the process expands upon operation 416 of FIG. 4. The system can begin by selecting an assertion from the set of assertions (operation 602), and receiving the second subset of assumptions, which over-approximates the first set of assumptions for the CUV (operation 604).

Next, the system determines whether a state exists for the CUV in which the assertion is not satisfied, but the second subset of assumptions is satisfied (operation 606). If the system determines that such a state does not exist for the CUV, then the system reports that the assertion is satisfied by the CUV (operation 612), and the process ends.

If a state exists for the CUV in which the assertion is not satisfied while the second subset of assumptions is satisfied, then the system modifies the first subset of assumptions to obtain a third subset of assumptions which is not logically equivalent to the first subset of assumptions, and which is different from the second subset of assumptions (operation 608). Specifically, the third subset of assumptions can be an over-approximation of the first subset of assumptions which is different from the second set of assumptions.

Next, the system verifies the CUV by at least determining whether the CUV satisfies the assertion when the third subset of assumptions is satisfied (operation 610). Then, the system returns to operation 606 to determine whether the first subset of assumptions needs to be modified again to obtain a new subset of assumptions which is different from the second and the third subset of assumptions.

Figure 7:
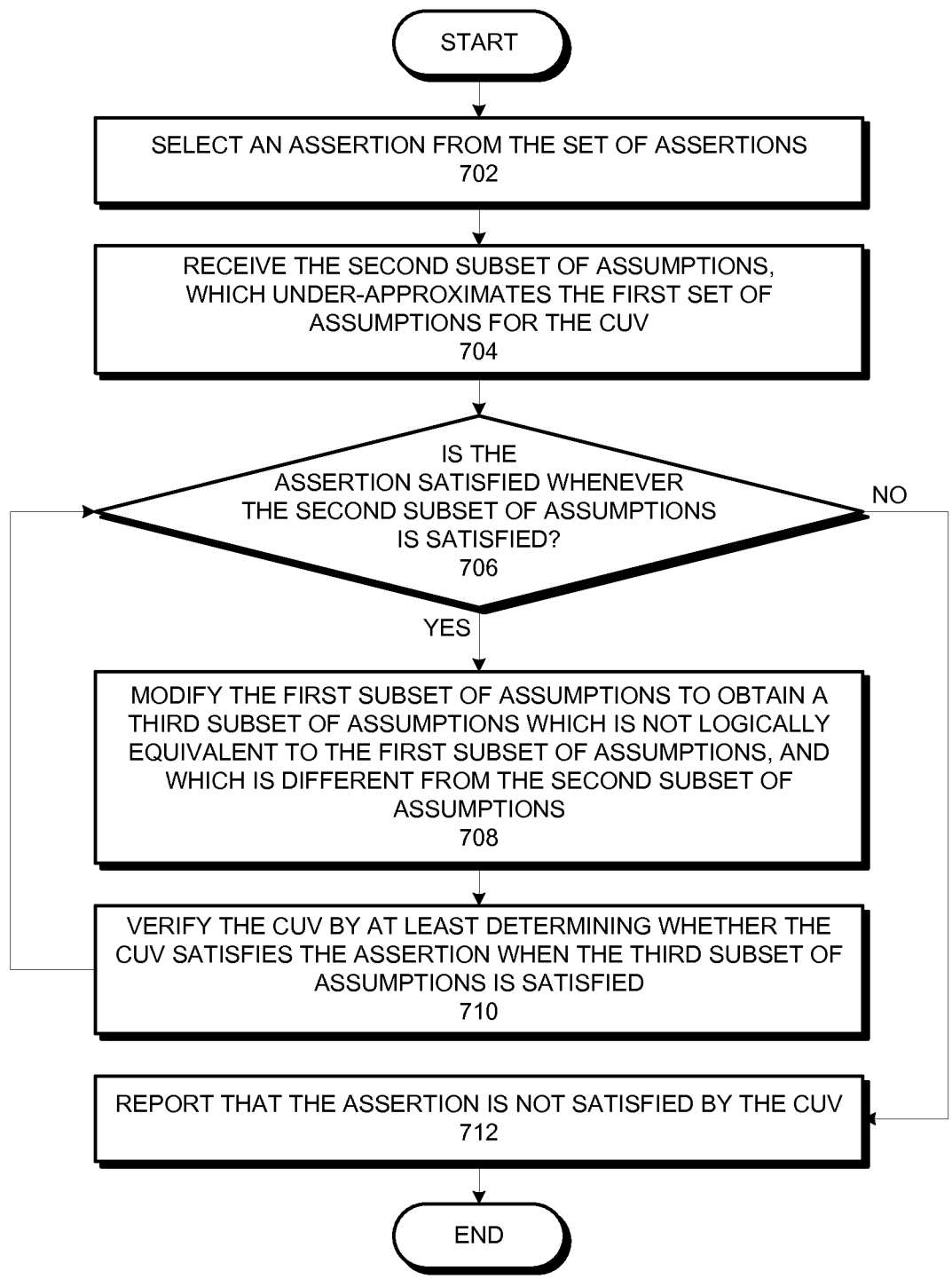
FIG. 7 presents a flow chart illustrating a process for verifying a circuit design by refining a subset of assumptions which under-approximates an initial set of assumptions in accordance with an embodiment of the present invention.

FIG. 7 presents a flow chart illustrating a process for verifying a circuit design by refining a subset of assumptions which under-approximates an initial set of assumptions in accordance with an embodiment of the present invention. In some embodiments, the process expands upon operation 416 of FIG. 4.

The system can begin by selecting an assertion from the set of assertions (operation 702), and receiving the second subset of assumptions, which under-approximates the first set of assumptions for the CUV (operation 704).

Next, the system determines whether the assertion is satisfied whenever the second subset of assumptions is satisfied (operation 706). If not (i.e., the system determines that a state exists in which the assertion is not satisfied when the second subset of assumptions is satisfied), the system reports that the assertion is not satisfied by the CUV (operation 712), and the process ends.

If the assertion is satisfied whenever the second subset of assumptions is satisfied, then the system modifies the first subset of assumptions to obtain a third subset of assumptions which is not logically equivalent to the first subset of assumptions, and which is different from the second subset of assumptions (operation 708). Specifically, the third subset of assumptions can be an under-approximation of the first subset of assumptions that is different from the second subset of assumption.

Next, the system verifies the CUV by at least determining whether the CUV satisfies the assertion when the third subset of assumptions is satisfied (operation 710). Then, the system returns to operation 706 to determine whether the first subset of assumptions needs to be modified again to obtain a new subset of assumptions which is different from the second and the third subset of assumptions.

Figure 8:
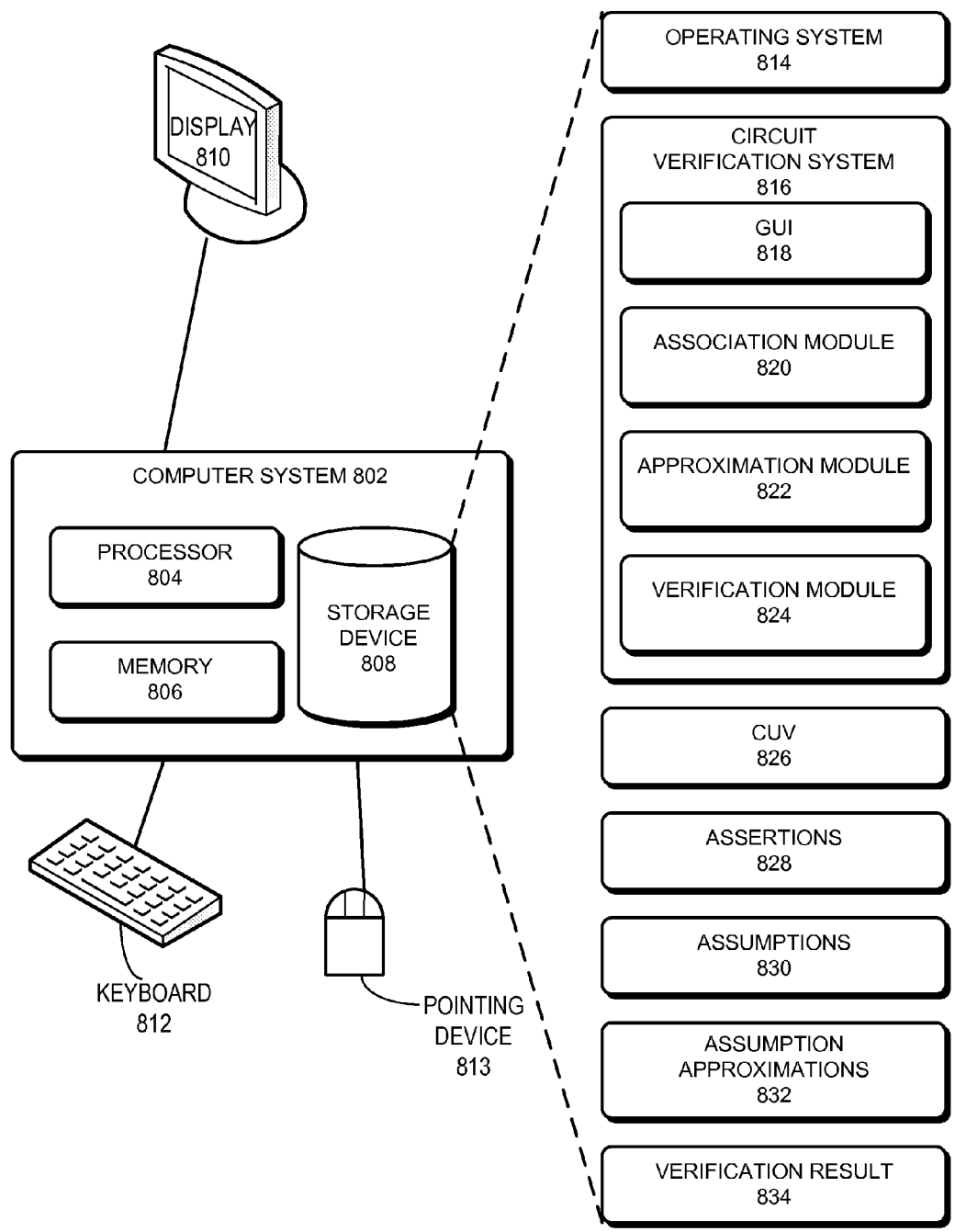
FIG. 8 illustrates an exemplary computer system that facilitates verifying a circuit design by approximating assumptions in accordance with an embodiment of the present invention.

FIG. 8 illustrates an exemplary computer system that facilitates verifying a circuit design by approximating assumptions in accordance with an embodiment of the present invention. Computer system 802 includes a processor 804, a memory 806, and a storage device 808. Furthermore, computer system 802 can be coupled to a display device 810, a keyboard 812, and a pointing device 813.

Storage device 808 stores an operating system 814, a circuit verification system 816, a CUV 826, a set of assertions 828, a set of assumptions 830, a set of assumption approximations 832, and a verification result 834. Circuit verification system 816 can include a graphical user interface (GUI) 818, an association module 820, an approximation module 822, and a verification module 824. The modules shown in FIG. 8 are for illustration purposes only and are not intended to limit the present invention to the forms disclosed.

During operation, circuit verification system 816 is loaded from storage device 808 into memory 806 and is executed by processor 804. In some variations, circuit verification system 816 can be implemented in a hardware module, such as an ASIC or an FPGA. In some embodiments, circuit verification system 816 can generate a set of assumption approximations 832 which are associated with an assertion in the set of assertions 828, such that assumption approximations 832 either over-approximate or under-approximate assumptions 830. To do so, association module 820 identifies a first subset of assumptions, from assumptions 830, which are associated with the assertion. Then, association module 820 rewrites the first subset of assumptions to generate a second subset of assumptions which is logically equivalent to assumptions 830.

Next, approximation module 822 generates assumption approximations 832 which are not logically equivalent to the first subset of assumptions. Specifically, assumption approximations 832 either over-approximate or under-approximate the first subset of assumptions. Verification module 824 then verifies CUV 826 by at least determining whether CUV 826 satisfies the assertion when assumption approximations 832 are satisfied.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method to formally verify a circuit design, the method comprising:
   simplifying a first set of assumptions to obtain a second set of assumptions, wherein the second set of assumptions is logically equivalent to the first set of assumptions, and wherein the first set of assumptions and the second set of assumptions correspond to allowable input assignments for the circuit design;
   associating, by computer, a first subset of assumptions with an assertion in a set of assertions, wherein the first subset of assumptions is a subset of the second set of assumptions, and wherein satisfying the assertion corresponds to a desired behavior of circuit design;
   modifying the first subset of assumptions to obtain a second subset of assumptions which is not logically equivalent to the first subset of assumptions; and
   proving that the circuit design satisfies the assertion when the second subset of assumptions is satisfied.

2. The method of claim 1, wherein associating the first subset of assumptions with the assertion in the set of assertions involves:
   associating an initial subset of assumptions with the assertion, wherein an assumption is associated with an assertion if the assumption, either directly or indirectly, shares logic with the assertion; and
   removing at least a first assumption from the initial subset of assumptions if the assertion is satisfiable regardless of whether the first assumption is satisfied or not.

3. The method of claim 1, wherein the second subset of assumptions is an over-approximation of the first set of assumptions.

4. The method of claim 3, wherein the circuit design satisfies the assertion if the assertion is satisfied whenever the second subset of assumptions is satisfied.

5. The method of claim 4, further comprising:
   in response to determining that a state exists in which the assertion is not satisfied but the second subset of assumptions is satisfied,
      modifying the first subset of assumptions to obtain a third subset of assumptions which is not logically equivalent to the first subset of assumptions, and which is different from the second subset of assumptions, and
      verifying the circuit design by at least determining whether the circuit design satisfies the assertion when the third subset of assumptions is satisfied.

6. The method of claim 1, wherein the second subset of assumptions is an under-approximation of the first set of assumptions.

7. The method of claim 6, wherein the circuit design does not satisfy the assertion if a state exists in which the second subset of assumptions is satisfied but the assertion is not satisfied.

8. The method of claim 7, further comprising:
   in response to determining that the assertion is satisfied whenever the second subset of assumptions is satisfied,
      modifying the first subset of assumptions to obtain a third subset of assumptions which is not logically equivalent to the first subset of assumptions, and which is different from the second subset of assumptions, and
      verifying the circuit design by at least determining whether the circuit design satisfies the assertion when the third subset of assumptions is satisfied.

9. A non-transitory computer-readable storage medium storing instructions that, when executed by a computer, cause the computer to perform a method to formally verify a circuit design, the method comprising:
   simplifying a first set of assumptions to obtain a second set of assumptions, wherein the second set of assumptions is logically equivalent to the first set of assumptions, and wherein the first set of assumptions and the second set of assumptions correspond to allowable input assignments for the circuit design;
   associating a first subset of assumptions with an assertion in a set of assertions, wherein the first subset of assumptions is a subset of the second set of assumptions, and wherein satisfying the assertion corresponds to a desired behavior of circuit design;
   modifying the first subset of assumptions to obtain a second subset of assumptions which is not logically equivalent to the first subset of assumptions; and
   proving that the circuit design satisfies the assertion when the second subset of assumptions is satisfied.

10. The non-transitory computer-readable storage medium of claim 9, wherein associating the first subset of assumptions with the assertion in the set of assertions involves:
    associating an initial subset of assumptions with the assertion, wherein an assumption is associated with an assertion if the assumption, either directly or indirectly, shares logic with the assertion; and
    removing at least a first assumption from the initial subset of assumptions if the assertion is satisfiable regardless of whether the first assumption is satisfied or not.

11. The non-transitory computer-readable storage medium of claim 9, wherein the second subset of assumptions is an over-approximation of the first set of assumptions.

12. The non-transitory computer-readable storage medium of claim 11, wherein the circuit design satisfies the assertion if the assertion is satisfied whenever the second subset of assumptions is satisfied.

13. The non-transitory computer-readable storage medium of claim 12, further comprising:
    in response to determining that a state exists in which the assertion is not satisfied but the second subset of assumptions is satisfied,
       modifying the first subset of assumptions to obtain a third subset of assumptions which is not logically equivalent to the first subset of assumptions, and which is different from the second subset of assumptions, and
       verifying the circuit design by at least determining whether the circuit design satisfies the assertion when the third subset of assumptions is satisfied.

14. The non-transitory computer-readable storage medium of claim 9, wherein the second subset of assumptions is an under-approximation of the first set of assumptions.

15. The non-transitory computer-readable storage medium of claim 14, wherein the circuit design does not satisfy the assertion if a state exists in which the second subset of assumptions is satisfied but the assertion is not satisfied.

16. The non-transitory computer-readable storage medium of claim 15, further comprising:

in response to determining that the assertion is satisfied whenever the second subset of assumptions is satisfied, modifying the first subset of assumptions to obtain a third subset of assumptions which is not logically equivalent to the first subset of assumptions, and which is different from the second subset of assumptions, and verifying the circuit design by at least determining whether the circuit design satisfies the assertion when the third subset of assumptions is satisfied.

17. An apparatus for verifying a circuit design, comprising: an association mechanism configured to:

simplify a first set of assumptions to obtain a second set of assumptions, wherein the second set of assumptions is logically equivalent to the first set of assumptions, and wherein first set of assumptions and the second set of assumptions are correspond to allowable input assignments for the circuit design; and associate a first subset of assumptions with an assertion in a set of assertions, wherein the first subset of assumptions is a subset of the second set of assumptions, and wherein satisfying the assertion corresponds to a desired behavior of circuit design;

an approximation mechanism configured to modify the first subset of assumptions to obtain a second subset of assumptions which is not logically equivalent to the first subset of assumptions; and a formal verification mechanism configured to prove that the circuit design satisfies the assertion when the second subset of assumptions is satisfied.

18. The apparatus of claim 17, wherein associating the first subset of assumptions with the assertion in the set of assertions involves:

associating an initial subset of assumptions with the assertion, wherein an assumption is associated with an assertion if the assumption, either directly or indirectly, shares logic with the assertion; and removing at least a first assumption from the initial subset of assumptions if the assertion is satisfiable regardless of whether the first assumption is satisfied or not.

19. The apparatus of claim 17, wherein the second subset of assumptions is an over-approximation of the first set of assumptions.

20. The apparatus of claim 19, wherein the circuit design satisfies the assertion if the assertion is satisfied whenever the second subset of assumptions is satisfied.

21. The apparatus of claim 20, wherein if the verification mechanism determines that a state exists in which the assertion is not satisfied but the second subset of assumptions is satisfied, the approximation mechanism is further configured to modify the first subset of assumptions to obtain a third subset of assumptions which is not logically equivalent to the first subset of assumptions, and which is different from the second subset of assumptions, and the verification mechanism is further configured to verify the circuit design by at least determining whether the circuit design satisfies the assertion when the third subset of assumptions is satisfied.

22. The apparatus of claim 17, wherein the second subset of assumptions is an under-approximation of the first set of assumptions.

23. The apparatus of claim 22, wherein the circuit design does not satisfy the assertion if a state exists in which the second subset of assumptions is satisfied but the assertion is not satisfied.

24. The apparatus of claim 23, wherein if the verification mechanism determines that the assertion is satisfied whenever the second subset of assumptions is satisfied, the approximation mechanism is further configured to modify the first subset of assumptions to obtain a third subset of assumptions which is not logically equivalent to the first subset of assumptions, and which is different from the second subset of assumptions, and the verification mechanism is further configured to verify the circuit design by at least determining whether the circuit design satisfies the assertion when the third subset of assumptions is satisfied.

* * * * *